US012657938B2

(12) United States Patent
O'Keeffe

(10) Patent No.: US 12,657,938 B2
(45) Date of Patent: Jun. 16, 2026

(54) METHOD FOR DETECTING CORRESPONDENCE OF A BUILT STRUCTURE WITH A DESIGNED STRUCTURE

(71) Applicant: BIM & Scan Limited, Balbriggan (IE)

(72) Inventor: Shawn O'Keeffe, Balbriggan (IE)

(73) Assignee: BIM & SCAN LIMITED, County Dublin (IE)

( * ) Notice: Subject to any disclaimer, the term of this patent is extended or adjusted under 35 U.S.C. 154(b) by 677 days.

(21) Appl. No.: 17/906,780

(22) PCT Filed: Mar. 19, 2021

(86) PCT No.: PCT/EP2021/057149
§ 371 (c)(1),
(2) Date: Sep. 20, 2022

(87) PCT Pub. No.: WO2021/186067
PCT Pub. Date: Sep. 23, 2021

(65) Prior Publication Data
US 2023/0147610 A1 May 11, 2023

(30) Foreign Application Priority Data

Mar. 20, 2020 (GB) ...................................... 2004126

(51) Int. Cl.
*G06V 20/64* (2022.01)
*G06F 30/20* (2020.01)
(Continued)

(52) U.S. Cl.
CPC ............ *G06V 20/653* (2022.01); *G06F 30/20* (2020.01); *G06T 7/0006* (2013.01); *G06V 10/56* (2022.01);
(Continued)

(58) Field of Classification Search
CPC .... G06V 20/653; G06V 10/56; G06V 30/274; G06F 30/20; G06F 30/13; G06T 7/0006;
(Continued)

(56) References Cited

PUBLICATIONS

Bordie, S., et al. "The BIM and Scan® platform: A cloudbased cyber-physical system for automated solutions utilising real and virtual worlds." Proc CitA 3rd BIM Gathering—Building capabilities in complex environments, Dublin (2017): 138-144. (Year: 2017).*

(Continued)

*Primary Examiner* — Amandeep Saini
*Assistant Examiner* — Denise G Alfonso
(74) *Attorney, Agent, or Firm* — Brian J. Colandreo; Jeffrey T. Placker; Holland & Knight LLP

(57) ABSTRACT

This invention relates to a computer implemented method for detecting correspondence of a built structure with a designed structure. The method comprises the steps of: receiving an unorganized point cloud (PC) of the built structure, the unorganized PC containing a data set with a plurality of data points, each of which has an RGB value associated therewith; receiving an Industry Foundation Classes (IFC) model of the designed structure, the IFC model including an IFC schema file classifying all object types and object characteristics in the IFC model, the object characteristics including a model object RGB value; integrating the unorganized PC with the IFC model and generating a semantic point cloud by overwriting the RGB value of the data point in the PC with the model object RGB value from the IFC model. In this way, the resulting PC will be easier to evaluate and the evaluation will be more effective.

21 Claims, 5 Drawing Sheets

(51) Int. Cl.
  *G06T 7/00*          (2017.01)
  *G06V 10/56*         (2022.01)
  *G06V 30/262*        (2022.01)

(52) U.S. Cl.
  CPC .. *G06V 30/274* (2022.01); *G06T 2207/10028*
                                                (2013.01)

(58) Field of Classification Search
  CPC ......... G06T 2207/10028; G06T 7/0008; G06T
                                                17/00
  See application file for complete search history.

(56) References Cited

PUBLICATIONS

Bosché, Frederic, et al. "Tracking the built status of MEP works: Assessing the value of a Scan-vs-BIM system." Journal of computing in civil engineering 28.4 (2014): 05014004. (Year: 2014).*

Gordon, Chris, et al. "Combining reality capture technologies for construction defect detection: A case study." EIA9: E-Activities and Intelligent Support in Design and the Built Environment, 9th EuropIA International Conference. 2003. (Year: 2003).*

Bonduel, Mathias, et al. "The IFC to linked building data converter: current status." 6th International Workshop on Linked Data in Architecture and Construction. ceur-ws. org, 2018. (Year: 2018).*

Bosché, Frédéric, et al. "The value of integrating Scan-to-BIM and Scan-vs-BIM techniques for construction monitoring using laser scanning and BIM: The case of cylindrical MEP components." Automation in construction 49 (2015): 201-213. (Year: 2015).*

Bosche et al, "The value of integrating Scan-to-BIM and Scan-vs-BIM techniques for construction monitoring using laser scanning and BIM: The case of cylindrical MEP components," Automation in Construction, vol. 49, Jan. 1, 2015, pp. 201-213.

Brodie et al, "The BIM & Scan Platform: A Cloud-Based Cyber-Physical System for Automated Solutions Utilising Real & Virtual Worlds," CITA BIM Gathering 2017, Sep. 21, 2017, pp. 1-9.

International Search Report and Written Opinion issued in Application Serial No. PCT/EP2021/057149 on Jun. 28, 2021.

* cited by examiner

METHOD FOR DETECTING CORRESPONDENCE OF A BUILT STRUCTURE WITH A DESIGNED STRUCTURE

RELATED APPLICATIONS

The subject application is a U.S. National Stage application of International Application No. PCT/EP2021/057149, filed on 19 Mar. 2021, which claims the benefit of Great Britain Application Serial No. 2004126.5, filed on 20 Mar. 2020. The content of each application is incorporated herein by reference in their entirety.

TECHNICAL FIELD

This invention relates to a method for detecting correspondence of a built structure with a designed structure. More specifically, the invention relates to a computer implemented method, a computer program product, and an apparatus for detecting correspondence of a built structure with a designed structure.

BACKGROUND ART

When undertaking any construction project, it is common practice to carry out regular inspections to monitor progress and to compare the built structure with the designed structure. This is often carried out at the end of a process to determine whether the built structure corresponds to what was designed but is also carried out during the construction process to ensure that issues will not arise later on in the build. For example, it is not uncommon to compare the built structure with the designed structure at several stages during the construction of an assembly line or plant installation to ensure that individual components of the installation are indeed present and located in the correct position for subsequent engagement of other components. If a component is absent or positioned incorrectly, this can lead to further problems and delays later on in the build. Similarly, at the end of a construction project, it is common practice to carry out such an inspection to ensure that the built structure corresponds to the designed structure and complies with any planning requirements or other conditions that may apply.

Heretofore, the techniques used for inspecting the built structure and comparing it with the designed structure are largely manual, tedious, and time consuming. A great deal of the comparison is largely subjective and therefore open to interpretation and dispute. One increasingly popular technique known in the art is to generate a point cloud of the built structure and then compare that point cloud with a 3D model of the designed structure. By doing so, in some cases it is possible to identify aspects of the point cloud that do not correspond with the designed structure and therefore possibly represent a deviation of the built structure from the designed structure.

One of the current techniques entails comparing the point cloud with a 3D mesh model. However, although the point cloud data is useful, it is often difficult to decipher precisely what data points in the point cloud correspond to the objects in the 3D mesh model. Furthermore, this technique is often thrown into disarray if there is an object that cannot be identified. Another technique known in the art is to compare two point clouds of the same structure taken at different times/dates to determine what object(s) in the more recent point cloud differ from those in the previous point cloud. This enables the user to determine what has changed and the progress that has been made. Again however, it is often difficult to decipher what objects the data points in the point cloud represent and difficulties arise if an object cannot be identified.

United States Patent Application Publication No. US2004/0254758, in the name of Chang, discloses a system and method for detecting defects of objects based on a CAD platform. US2004/0254758 discloses a data comparing module used for comparing point cloud data with a three-dimensional model of the object, obtaining deviations in the x-y-z Cartesian co-ordinates, and indicating different deviations by using different colours. A report management module is used for generating a colour comparison report according to comparison results generated by the data comparison module and outputting and storing the colour comparison report.

United States Patent Application Publication No. US2009/0160852, in the name of Chang et al, discloses a system for measuring a three-dimensional object. The system measures differences between a 3D model of an object and a point cloud of the object, and highlights the differences on the 3D model using different colours according to different ranges that the differences fall.

Chinese Patent Application Publication No. CN110986760, in the name of the University of Tongji, discloses a special-shaped size inspection method and system based on three-dimensional reconstruction. It is understood that the method and system generate a point cloud model and compare the point cloud model with a 3D design model in order to generate an error cloud map.

Throughout this specification, reference will be made to a construction project, a built structure, and a designed structure. This structure could be a building (interior and/or exterior), a road, a bridge, or other structure. Indeed, it will be understood that the present invention is not limited to civil engineering projects and could equally apply to other articles of manufacture such as, but not limited to consumer goods, electronics, and the like.

It is an object of the present invention to provide a computer implemented method, a computer program product, an apparatus, and a system that overcome at least some of the problems with the known solutions. It is a further object of the present invention to provide a useful alternative choice to the consumer.

SUMMARY OF INVENTION

According to the invention there is provided a computer implemented method for detecting correspondence of a built structure with a designed structure comprising the steps of:

receiving an unorganized point cloud (PC) of the built structure, the unorganized PC containing a data set with a plurality of data points, each of which has an RGB value associated therewith;

receiving an Industry Foundation Classes (IFC) model of the designed structure, the IFC model including an IFC schema file classifying all object types and object characteristics in the IFC model, the object characteristics including a model object RGB value unique to each IFC object's entity type;

integrating the unorganized PC with the IFC model;

identifying objects in the unorganized PC by determining the data points in the unorganized PC that correspond to an object in the IFC model; and generating a semantic point cloud, the semantic point cloud comprising the data points from the unorganized PC, and for those data points in the semantic point cloud that correspond to an object in the IFC model, overwriting the RGB value of the data point with the model object RGB value from the IFC model.

By having such a method, it is possible to identify all objects in the point cloud that are also present in the model and clearly distinguish those objects from all other objects in the point cloud. It is also possible to clearly identify those data points that do not correspond to an object in the model. The computer implemented method performs a colour coded enrichment of the unorganised point cloud data set. It does this by transforming the existing RGB values in the point cloud data set file with new and consistent replacement RGB values that represent distinct types of objects according to a standard ontology and schema provided by the IFC model. Each object found in the unorganised point cloud data set is given a unique colour for that object. The computer implemented method according to the invention can colourise according to ontology, schema and/or a per-object basis. By doing so, the method transforms the given point cloud into a more intelligible knowledge-based data set, which objectively displays that the objects recognised are in fact particular objects. Importantly, this will enable more efficient and effective decision making by the person charged with the task of evaluating the built structure and its correspondence to the designed structure.

Throughout this specification, reference is made to an unorganised point cloud (PC). An unorganized PC will be understood to be a set of data points, with no derived or structured information assigned to each point, except for their position (XYZ) in space relative to a coordinate origin. In short, it refers simply to points in space with no real meaning that are subjective to human interpretation. Unorganized PC's are point clouds that have not had a segmentation computation conducted upon them. Unorganized PC's for the purpose of this invention, and also commonly known in the research community, are inclusive of PC's with RGB values that come from camera images. These RGB values are given to the x,y,z,r,g,b PC file for the purpose of human interpretation, nevertheless, are fully subjective, and these RGB values are not part of nor a result of a segmentation computation. Hence PC's with RGB values from cameras, images. etc. are also "Unorganised".

The step of integrating the PC and IFC involves transforming both of their local coordinate systems into a shared, global, coordinate system, such that they can be placed into the same 3D space. The PC and IFC may or may not be aligned after this transformation, based on their positions in the local coordinates they possess. The onus is on users to pre-align their PC and IFC before applying this method of analysis. This is called PC and Model "registration" and shall be a prerequisite. The ideal result of proper alignment/ registration is the PC and IFC present in the same space, intersecting/overlapping with each other.

In one embodiment of the invention there is provided a computer implemented method in which the method comprises the intermediate step of: determining the scan origin.

The scan origin is determined by either taking the local origin of the PC relative to its position in the global coordinate system and using that point as the scan 'origin' (the term for this is the scan "pose", or by utilizing a pre-recorded scan origin position stored in the input PC file, produced by the original laser scanning process, or by computing a new centre point or average (centroid) point based on all of the points in the PC. The benefit of/need for defining a scan origin is that it allows a direct one-to-many creation of rays from a common origin, towards each point. This is necessary for ray-casting.

In one embodiment of the invention there is provided a computer implemented method in which the method comprises the intermediate step of: defining trajectories from the scan origin to each of the data points in the data set of the unorganized PC.

The trajectory for each scan pose is defined by a direction vector. For each point in the PC: a direction vector is derived by subtracting the point's coordinate from the scan origin coordinate and normalising the result, and this direction vector describes the trajectory of the ray to be cast towards that point. This produces a set of trajectories, one for each point, that project outwards from the scan origin to cover all data points in the PC. The advantage of this method step is that it accounts for every point in the dataset, providing a ray to cast for each point.

In one embodiment of the invention there is provided a computer implemented method in which the step of identifying objects in the unorganized PC by determining the data points in the unorganized PC that correspond to an object type in the IFC model comprise the step of:

applying a ray casting object recognition technique from a scan origin on defined trajectories.

In one embodiment of the invention there is provided a computer implemented method in which the ray casting object recognition technique includes the steps of: (i) targeting; (ii) capturing; (iii) defining; and (iv) storing data points, objects and ray depths within a maximum tolerance value, epsilon ($\varepsilon$).

Typically, the maximum tolerance value will be set in millimeters (in increments of 0.001 meters). It is envisaged that the user will have some discretion to select a tolerance value. This may also depend on the structure in question as some structures may have a more or less forgiving tolerance than others.

In one embodiment of the invention there is provided a computer implemented method in which each of the captured data points are compared to the maximum tolerance value, epsilon, and those data points that are within the maximum tolerance value epsilon ($\varepsilon$) with respect to each other are stored as associated data points.

In this way, data points that are closely bunched together will generally be identified as being part of the same object. All of the associated data points may be grouped together so that they may be coloured in the same way, modified in the same way and also may be "called up" together so that the object may be inspected by a user. In other words, the user can select an object for inspection and all the data points of that object will be identified and displayed for inspection by the user, together with other data points or in isolation from other data points.

In one embodiment of the invention there is provided a computer implemented method in which each of the data points that do not correspond to an object in the IFC model are stored separately. In this way, any data point that is not associated with an object is either a component or object that is out of position or a component that is not supposed to be in the design at all. These objects and components may then be highlighted individually or together for subsequent analysis by a user.

In one embodiment of the invention there is provided a computer implemented method comprising the step of defining a unique ID for each data point. The advantage of this step is that it enables random access of each point's data, e.g. XYZ coordinate or RGB colour, as needed by the method during later steps. To clarify in relation to "unique ID" for points, each data point is represented by a numeric index. An index is the location of a particular element in the array. Indices range from 0->P, where P is the size of the PC, i.e. number of points in the dataset, and points in the array can be accessed by choosing index values between 0 and P. This index is a natural property of storing the data as an array and allows other parts of the program to reference specific data points. As a result, point indices are always unique to a single point.

In one embodiment of the invention there is provided a computer implemented method in which the IFC model is a model view definition (MVD). For example, the MVD may be generated in accordance with ISO 10303 Part 21 formatted model views. Such an MVD is seen as a particularly useful IFC model to use with the present invention as it will be semantic and ontology based and rich with information regarding objects in the model. The ontology and schema could, for example, be ISO 16739 Industry Foundation Classes (IFC) data. This would be useful as it is a generally accepted standard for objects and their representation that would be understood in the industry.

In one embodiment of the invention there is provided a computer implemented method in which the IFC model is in Step Physical File Format (SPFF). Again, the SPFF (.stp) will be semantic and ontology based, rich with information regarding objects contained in the model. It will also be relatively simple to manipulate and correspond to the data points in the unorganized point cloud data set. Furthermore, the model may be provided in .ifc exchange file format, also commonly used in building information modelling.

In one embodiment of the invention there is provided a computer implemented method in which the method comprises the step of serializing the semantic point cloud.

In one embodiment of the invention there is provided a computer implemented method in which an IFC model object type global unique identification (GUID) tag is assigned to data points that correspond to an object in the IFC model.

The GUID is IFC model dependent, i.e. a global unique identifier as specified by the ISO 16739 IFC data schema specification. According to the present invention, we can exploit this GUID for the specific reason it is the only single source for uniquely identifying each single IFC object entity type. The advantages of this are that it defines the semantic association between the PC and IFC datasets; and this is useful to link the IFC model objects to the points that are detected as corresponding and colour-coded appropriately.

In one embodiment of the invention there is provided a computer program product having program instructions stored thereon that when operated on a computer, cause the computer to carry out the method as claimed. In one embodiment of the invention there is provided a computing device including a processor and accessible memory, the memory having program instructions stored thereon that when executed by the processor, cause the computing device to carry out the method as claimed.

BRIEF DESCRIPTION OF THE DRAWINGS:

The invention will now be more clearly understood from the following description of some embodiments thereof given by way of example only with reference to the accompanying drawings, in which.

DETAILED DESCRIPTION OF THE DRAWINGS

Figure 1:
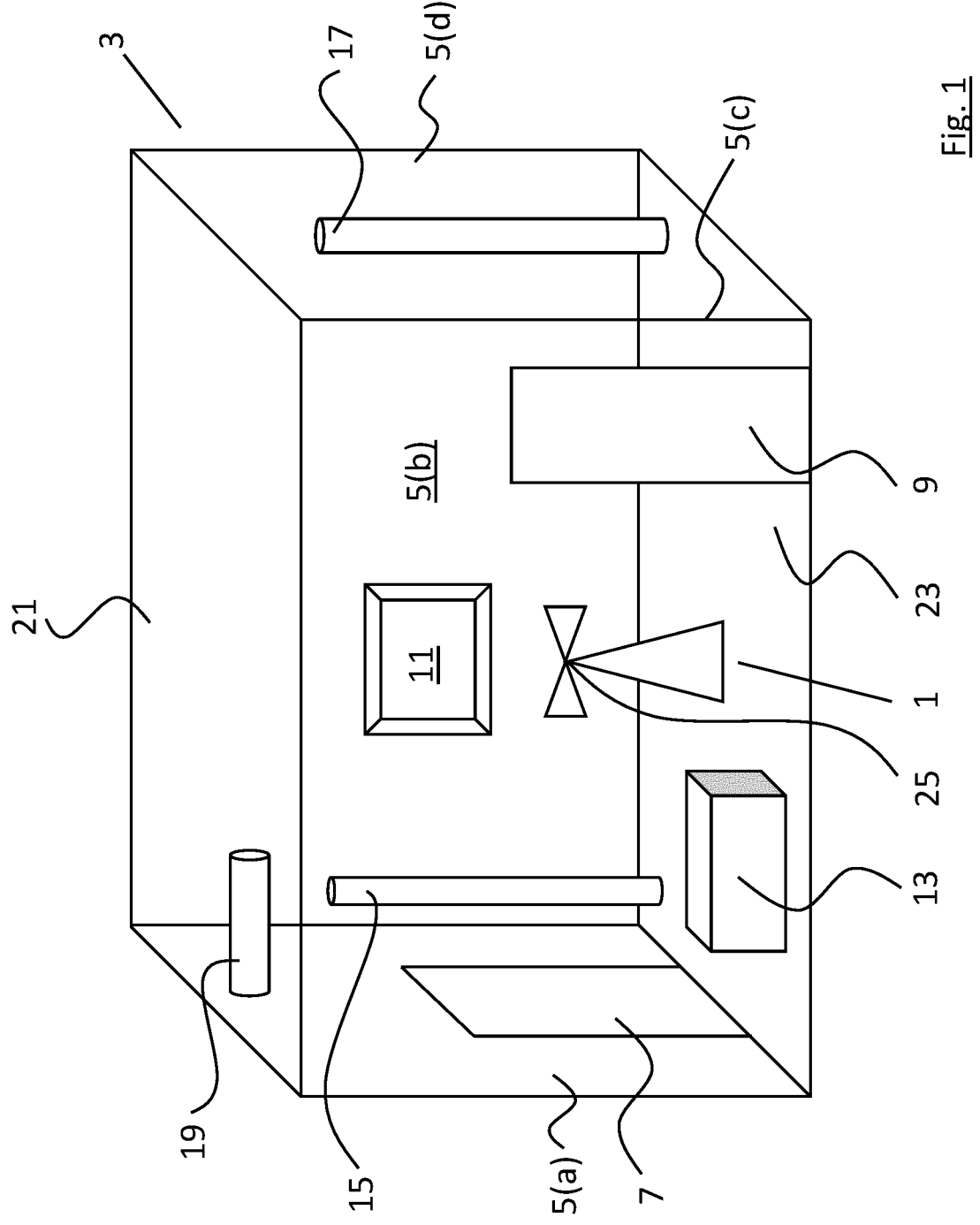
FIG. 1 is a diagrammatic representation of a 3D scanner generating a point cloud of a built structure.

Referring to FIG. 1, there is shown a diagrammatic representation of a 3D scanner, indicated generally by the reference numeral 1, generating an unorganised point cloud of a built structure, indicated generally by the reference numeral 3. The built structure in this instance is a room in which various objects are located including walls 5(*a*)-5(*d*), a pair of doorways 7, 9, a window opening 11, a generator 13, mechanical (e.g. water) ducting pipes 15, 17 and electrical cabling ducting 19. There is further provided a ceiling 21 and a floor 23. It will be understood that other objects could be provided however for the purposes of this illustration, only those shown are contained in the built structure.

As will be understood in the art, the 3D scanner 1 emits a plurality of laser traces radially outwardly from the point of origin 25 along defined trajectories from the point of origin. Each of the laser traces will impact on one of the objects in the room 3 and a data point is created at the point of impact of the laser trace. Over time, as more and more laser traces are emitted into the room, an array of data points will be generated, forming an unorganised point cloud. This unorganised point cloud is effectively therefore a representation of the interior of the room as viewed from the point of origin. A number of points of origins may be selected and a number of unorganised point clouds can be generated. The data points will each comprise a set of coordinates including X,Y, and Z coordinates relative to the point of origin and each data point is provided with an R, G, and B (RGB) value for the data point.

The RGB values for each of the data points in the unorganised point cloud may be the same. Alternatively, the RGB values in the unorganised PC may comprise a plurality of different RGB values such as in the case of an unorganised PC originating from a camera image. However, it will be understood that even though the RGB values may differ, the unorganised point cloud has not been segmented or organized. For simplicity and the purpose of this description, we will discuss the instance where the RGB values are the same.

Figure 2:
FIG. 2 is a diagrammatic representation of a point cloud superimposed on a model.

Referring to FIG. 2, there is shown a diagrammatic representation of an unorganised point cloud 31 superimposed on a model 33. The model 33 comprises a plurality of solid objects 35 whereas the unorganised point cloud 31 comprises a plurality of data points 37 in the unorganised point cloud. Typically, thousands of data points will be provided in the point cloud. It can be seen from FIG. 2 that the point cloud data points are (a) offset with respect to the solid objects in the model; and (b) are all effectively located to one side of the solid objects. It will be understood that the point cloud data points being offset with respect to the solid objects indicates that the solid object is in fact located not in the designed position of the model but instead is located offset to the desired position. It will be further understood that the point cloud data points being located to one side of the solid object is a result of the point of origin, i.e. scan pose/position, being located on that side of the solid object. The laser traces cannot pass through the solid object and they will only record data points that are in the direct line of sight of the 3D scanner from the point of origin.

Referring to FIG. 2 once more, it can be seen that:

Point cloud $\mathbb{P}$. is one terrestrial laser scan data capture with a single scan position, and $\mathbb{N}$ is an exclusive set of points in $\mathbb{P}$. $\mathbb{N} \in \mathbb{P}$.

$\mathbb{N}$ is also more frequent and $\mathbb{N} \neq \mathbb{P}$. .

Furthermore, $\mathbb{N}$ can be an empty set $\mathbb{N} = \theta$, if and only if an occlusion exist in $\mathbb{P}$. where Oj is present, or $\mathbb{P}$. does not exist $\mathbb{P}. = \theta$.

O is any IFC Entity Type in the design BIM.

$O_j$ is an IF Entity Type (model object such as valve) with a single GUID that has a corresponding $A_j$, e.g. IfcValve-Type.

$A_j$ is an exclusive subset of associated points only in $\mathbb{N}$, when $O_j$ is the corresponding object that belongs to $A_j$ in $\mathbb{N}$ .

$O_j \in A_j \subseteq \mathbb{N}$ $O_i$ is an IFC Entity Type with a single RID that has NO associated $A_j$.

$O - A_j = O_i$

It is possible, if desired, to provide multiple unorganised point clouds from multiple different points of origin and combine those unorganised point clouds into an aggregate point cloud to display objects from multiple sides of the objects and to generate a complete point cloud representation of the solid object from the model.

Figure 3:
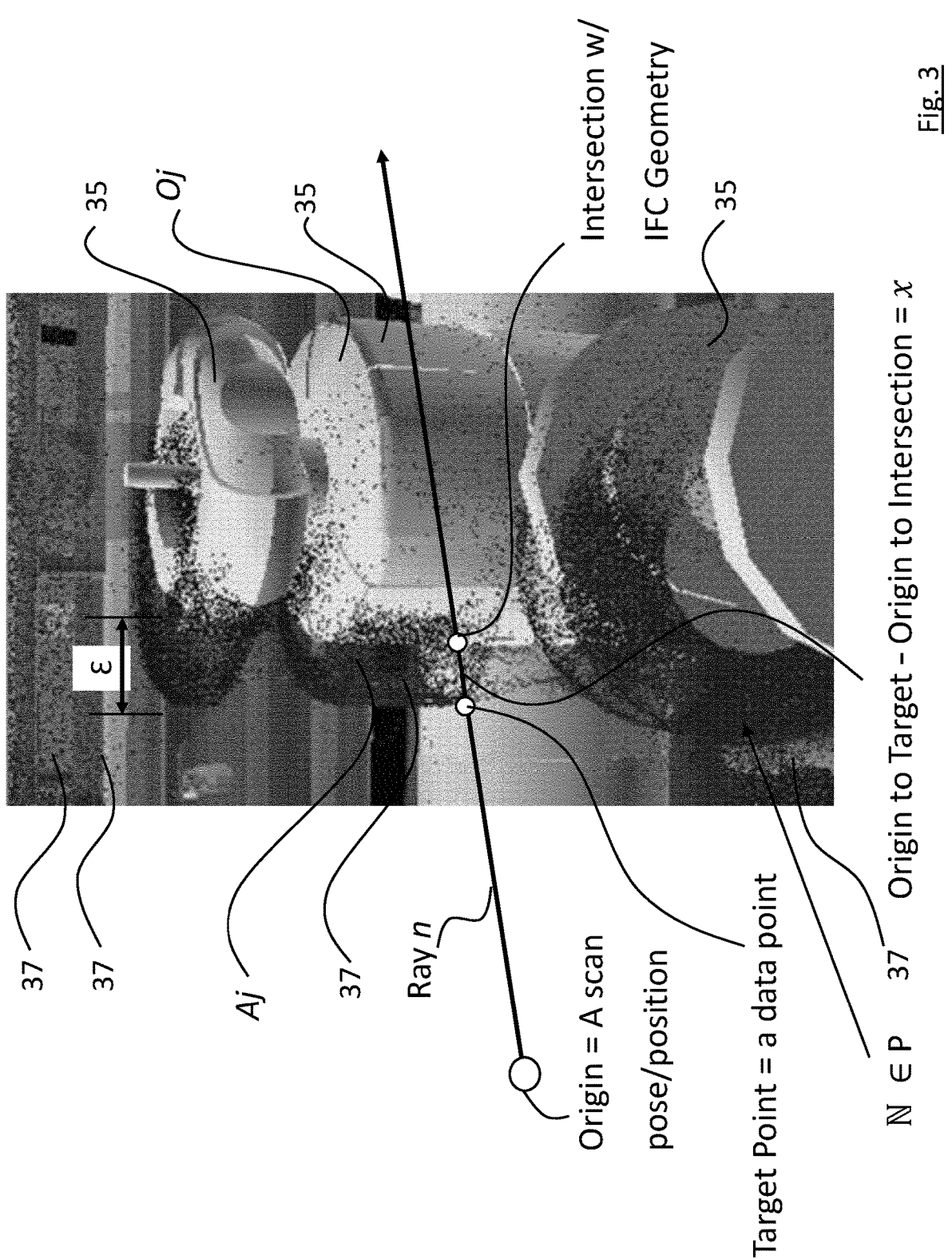
FIG. 3 is a view similar to FIG. 2 of a point cloud superimposed on a model illustrating a ray casting technique implemented in the method according to the invention.

Referring to FIG. 3, there is shown a view similar to FIG. 2 of a point cloud superimposed on a model illustrating a ray casting technique implemented in the method according to the invention, where like parts have been given the same reference numerals as before. In an initial step, the IFC geometry, i.e. the model, is loaded into ray-casting environment and the necessary data structures are then built (i.e. load into Embree OR OptiX). It will be understood that other ray casting engines may be used and the invention is not solely limited to the use of Embree or OptiX.

Building the necessary support data structures may include, for example, creating bounding-volume hierarchy trees, that are created by the ray-casting engine used in our current implementation. These are designed to accelerate the querying of rays against the model geometry, and are computed based on the 3D mesh geometry of the objects by wrapping bounding-volumes around the geometry for spatial queries. Bounding-volume hierarchies are used to conduct the ray-casting.

Then, for each scan origin position, a set of rays are created. Each ray of the set of rays is created by taking the scan position as its origin, and computing a target direction. The trajectory for each scan pose is defined by a direction vector. For each point in the PC: 1. a direction vector is derived by subtracting the point's coordinate from the scan origin coordinate and normalising the result, and 2. this direction vector describes the trajectory of the ray to be cast towards that point. The location of objects in the model is not considered, only the positions of points and the scan origin need to be considered. For example, if users have aligned their IFC and PC beforehand, then the "correct" placement of rays in the 3D scene should arise naturally, i.e. dispersed according to the distribution of points in the PC and cast along their trajectories towards the object geometry under analysis.

Once the target directions have been determined, the rays are cast into the 3D environment, and a record of each intersection of a ray with the model geometry is taken. Each of the points of intersection are stored in a new unorganized point cloud, along with a mapping to the IFC object GUID it came from. Once a ray intersects with valid geometry, i.e. "hits" to mark a point of intersection to be recorded, the IFC object data can be retrieved from the IFC model object, inclusive of the GUID, entity Type, and metadata like name, description, etc. The object geometry contains a mapping to the IFC component/object it was derived from, and this mapping can be used to perform IFC data retrieval.

In summary, the ray casting technique includes the steps of: (i) targeting; (ii) capturing; (iii) defining; and (iv) storing data points. The step of targeting entails, for each point, and the direction vector computed from the scan origin towards said point, casting a ray in that direction. The step of capturing entails the ray travelling through 3D space until it intersects with any object geometry representing the IFC model. The step of defining entails, upon intersection, an intersection result "check" if performed. If this check computation passes, the point is deemed to be corresponding to the object's surface. If the hit depth length 1) of the ray after intersection minus the depth length 2) of the ray between its origin and target point is below the epsilon value, as an absolute (positive) value, then the check computation passes as true. If the above epsilon value check fails as false, then the point is recorded as a non-corresponding point. Based on the angle of intersection, i.e. each ray as it hits an object surface, the depth comparison is adjusted to represent the perpendicular distance from the point to the surface, to avoid cases where due to the angle of the ray it's hit depth difference is greater than epsilon but the point's position actually is within epsilon based on shortest distance to surface. This ensures consistency among all results. The formula for adjustment: $\varepsilon_{adj} = \varepsilon / |(R \cdot N)|$, where $\varepsilon$ is the original epsilon threshold, $\varepsilon_{adj}$ is the adjusted epsilon threshold for the current intersection, R is the ray direction vector, and N is the surface normal.

In this way, there is a point cloud with a plurality of data points, each with coordinates and an RGB value, and a pointer towards the IFC object in the model.

According to another aspect of the present invention, there is provided the ability to provide produce reports in CSV format with the analysis data in text format, and automatic BCF (BIM Collaboration Format) messages that incorporate automatic camera view and navigation trajectories that enable the user to navigate and approve issues found and reported by the invention. In this way, the GUID is also used in the reports that are produced for distributing the analysis data in text format. In this particular case, CSV was utilized in this regard. The GUID is also used for automatic BCF file creation. BCF files are extensible similar to IFC and e57, and in this case we can exploit the camera view for issues detected by the method according to the invention, and these same camera views have encoded in them a function to navigate to detected issues between IFC model and PC, and non-issues too which are simply IFC model objects with no correspondence. This is done for the purpose of being 100% accountable for the whole IFC model, not only part that may have been installed on site. This may be just as important as design elements that were not constructed properly.

In order to perform the method, a first user scans the structure with a hardware scanner to capture 3D data. The 3D data is input data into a first computing device. The data is then formatted into an e57 point cloud representation format. The resulting data may be exchanged with a second user charged with carrying out the evaluation of the built structure to the designed structure. Alternatively, the second users actions may be carried out by the first user if desired.

The second user (or first user if a second user is not employed in the analysis) receives an IFC model from a third user (if the model is not already in the second user's possession). The second user uses their computing device to run computer program code for implementing the present invention. The computer program code on the second user's computing device automatically consumes both IFC model and e57 representation of the point cloud to transform the e57 point cloud representation into a semantic e57 point cloud representation. The semantic e57 point cloud representation is now a new data set that contains colorization of matching objects.

Figure 4:
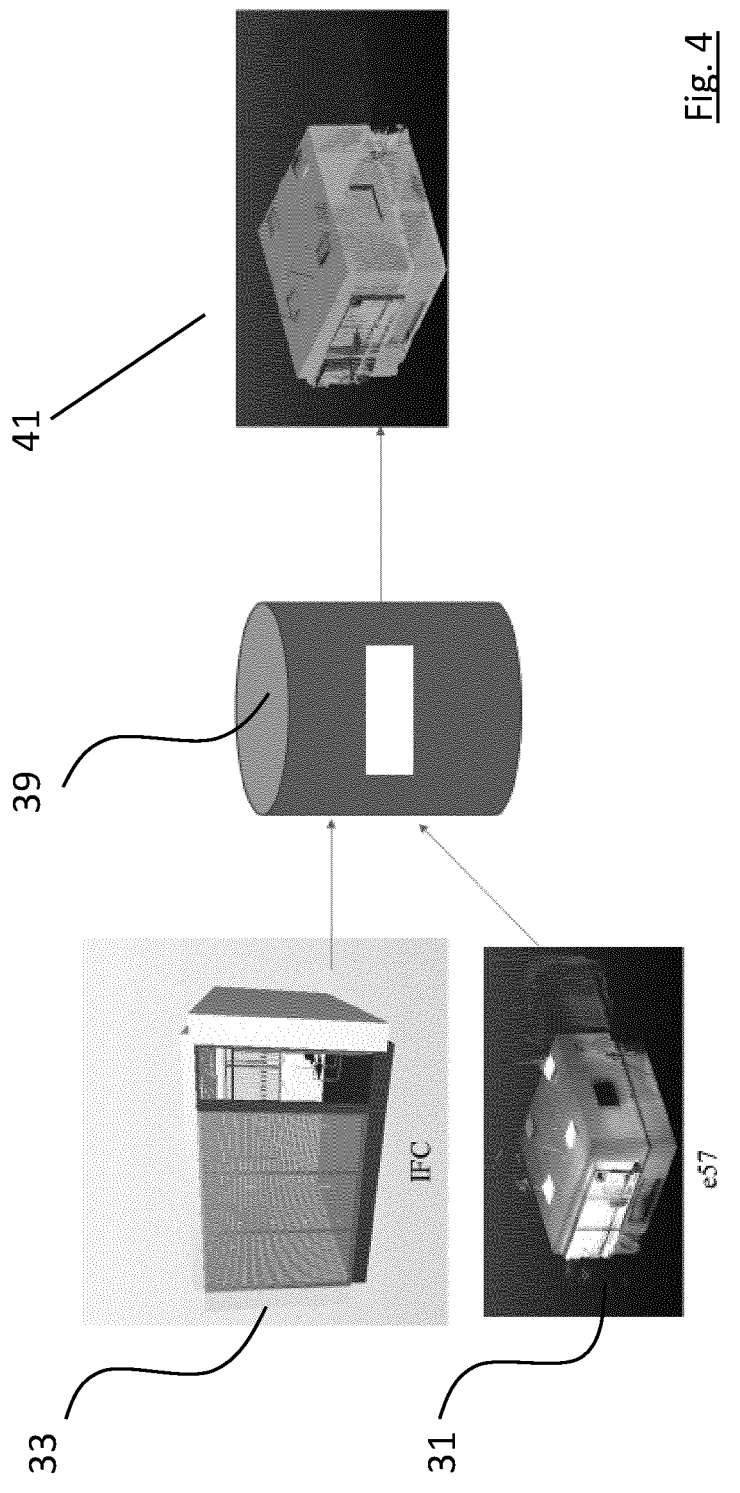
FIG. 4 is a diagrammatic representation of an unorganised point cloud and a model being integrated to generate a semantic point cloud.

Referring to FIG. 4, there is shown a diagrammatic representation of an unorganised point cloud 31 and a model 33 used as inputs and being integrated to generate a semantic point cloud. The model is an IFC format model and the point cloud is in e57 format. The model and the point cloud are passed to a processing device 39 and the processing device combines the IFC model and the point cloud to generate a semantic point cloud 41. The semantic point cloud has RGB colours for each of the data points based on ISO 16739 IFC ontology/data model. In this way, a wall will be of a first colour, a ceiling will be of a second colour, an electrical duct will be of a third colour, a doorway will be of a fourth colour and so on. It will be understood that the colourisation in this way brings further meaning and clarity to the point cloud that will enable a user to identify objects faster and analyse the built structure in a more effective and comprehensive fashion than was heretofore the case.

Figure 5:
FIG. 5 is a diagrammatic representation of the resulting semantic point cloud data set.

Referring to FIG. 5, there is shown a diagrammatic representation of the resulting semantic point cloud data set 43 corresponding to the semantic point cloud representation 41 shown in FIG. 4. The semantic point cloud data set 43 comprises coordinates 45 of each of the data points in the point cloud along with an RGB value 47 for each data point. The RGB value for each data point is provided from the RGB value for the object taken from the corresponding IFC model once the data point has been determined to correspond to a particular object. It will be understood that by representing the data cloud in this way, it will be possible to identify points with ease and to process those points if and as required.

The method according to the present invention may be summarized as comprising the following steps:

First of all, the scan origin method is determined. The scan origin is determined by either: (1) taking the local origin of the PC relative to its position the global coordinate system and using that point as the scan 'origin'; or (2) by utilising the pre-recorded scan origin position stored in the input PC file, produced by the original laser scanning process; or (3) by computing a centre point or average point (centroid) of all the point coordinates in the PC.

Once the scan origin method has been determined, the method performs a "run association method" step. The "association" method is the part of the implementation/method that creates the initial mapping between a point and object if a valid intersection "hit" is recorded for that ray. The association is the recording of the ray intersection, i.e. a "hit" between a point in the PC and a polygonal face of an IFC object geometry.

After the association method, the method comprises a run correspondence method step. The "run correspondence" method step determines the exact nature of a point-object association by applying the following epsilon threshold check steps (1) and (2): (1) If the computed distance from the point to the surface of the object is within the epsilon threshold, then the point-object association is flagged as corresponding, i.e. it belongs to the IFC object. (2) If the computed distance exceeds the epsilon threshold then the point-object association is flagged as non-corresponding, i.e. does not belong to an IFC object. As above , the formula for this check is as follows:

$$\varepsilon_{adj}=\varepsilon/|(R \cdot N)|,$$

where $\varepsilon$ is the original epsilon threshold, $\varepsilon_{adj}$ is the adjusted epsilon threshold for the current intersection, R is the ray direction vector, and N is the surface normal.

Once the correspondence step has been completed, the method comprises a "run transformation method" step. This is the step where the RGB value of the unorganized point cloud is replaced with the RGB value corresponding to the object in the IFC model. More specifically, the results of the association and correspondence steps are used for the transformation method. The "transformation" method involves the following process and steps: For each point-object association, the following steps are applied:

(1) Use the model element mapped to the point to lookup the original IFC semantic data stored in the program's runtime.; (2) Retrieve, based on the lookup, the IFC entity type classification of the object, per-point; and (3) Assign the RGB value for colour-coded visualisation based on the classification type as an attribute of the resulting semantic point cloud to each point, with the colour red (for example) used to denote non-corresponding points. The RGB value is retrieved from the IFC schema file that classifies all object types and object characteristics in the IFC model, including an RGB value unique to each IFC object's entity type.

Finally, once the transformation method step has been completed, the method comprises the step of performing a "serialize semantic point cloud" step. The "Serialising the semantic PC" step refers to saving the data to a file, in the case of the implementation according to the invention, an e57 PC file. To serialise the semantic PC, the array of data points in the semantic PC produced by the transformation method is iterated across and each point is saved to an output file. The semantic colour-coding is stored alongside each XYZ point as RGB values, i.e. x,y,z,r,g,b.

The advantage of saving/serializing the new resulting PC, is that it allows users of this method to evaluate the results by visualising the output file in their own software packages, i.e. e57 is an open standard supported widely among design and design review applications, similar to IFC, therefore the serialised result from the invention afford the user to use the tools they already have versus buying any new software to simply view the inventions resulting semantic point cloud.

In addition to the forgoing, serialising the semantic PC refers to saving the resulting computed data to a file. In this case, a new type of modified e57 point cloud file according to ASTM E2807-11(2019). e57 files by definition are extensible, therefore considered multidimensional in this respect. An example of this extensibility is the semantic based colour-coding that is stored alongside each XYZ point as RGB values, i.e. x,y,z,r,g,b. In other words, some e57 are only x,y,z, while others are x,y,z,r,g,b and so on. The advantage of this is it allows users of this method to evaluate the results by visualising the output file in their own software packages, and when doing so they can more clearly see the different IFC model object entity types, based on the semantic colourisation which is equal to the correct IFC class object entity types, e.g. IfcWallStandardCase vs IfcSlab or IfcFlowMovingDevice, and so on.

In some instances, another object may be occupying the position in the point cloud of an expected object, i.e. not the object that the user is expecting in the model but another object in the exact location. This is technically called a False Positive, which means association and correspondence has occurred, however, the IFC object entity type is wrong, e.g. IfcBeam was found when it should have been an IfcColumn. The result of this would simply be the associated and corresponding points are the wrong colour. In order to detect this, a "flag" that this has occurred is that the semantic point cloud colourisation is wrong and does not match the correct RGB colour in the IFC RGB schema file that was created to do the colourisation in the first place. The users of the invention have access to this colourisation file in PDF format so they can do these types of checks.

Some of the hardest points to identify are transition points between objects, i.e. where is the boundary between the object and an adjacent object. In order to correctly categorize points, the method increases the allowable/chosen tolerance value which decreases the tolerance, which reciprocally changes the boundary representation desired in this situation. By reducing the allowable/chosen tolerance value, i.e. increasing the tolerance, the "boundary" is chosen by the user and is equal to the max distance of ε chosen. Therefore, the degree of accuracy may be chosen by the user.

In addition to the foregoing, it is envisaged that various additional features known in the industry could be incorporated into the present invention if desired. For example, it is envisaged that so-called heat maps may be provided as an additional, optional output of the method and system for the benefit of the user.

Throughout the specification, reference is made to a user device or a computing device. The user device may be a mobile phone, a so-called smart phone, a tablet, a phablet, a laptop, a personal computer or other device capable of processing data.

It will be further understood that various parts of the present invention are performed in hardware and other parts of the invention may be performed either in hardware and/or software. It will be understood that the method steps and various components of the present invention will be performed largely in software and therefore the present invention extends also to computer programs, on or in a carrier, comprising program instructions for causing a computer or a processor to carry out steps of the method or provide functional components for carrying out those steps. The computer program may be in source code format, object code format or a format intermediate source code and object code. The computer program may be stored on or in a carrier, in other words a computer program product, including any computer readable medium, including but not limited to a floppy disc, a CD, a DVD, a memory stick, a tape, a RAM, a ROM, a PROM, an EPROM or a hardware circuit. In certain circumstances, a transmissible carrier such as a carrier signal when transmitted either wirelessly and/or through wire and/or cable could carry the computer program in which cases the wire and/or cable constitute the carrier.

It will be further understood that the present invention may be performed on two, three or more devices with certain parts of the invention being performed by one device and other parts of the invention being performed by another device. The devices may be connected together over a communications network. The present invention and claims are intended to also cover those instances where the system and/or method is operated across two or more devices or pieces of apparatus located in one or more locations.

In this specification the terms "comprise, comprises, comprised and comprising" and the terms "include, includes, included and including" are all deemed totally interchangeable and should be afforded the widest possible interpretation.

The invention is not solely limited to the embodiments hereinbefore described but may be varied in both construction and detail within the scope of the appended claims.

The invention claimed is:

1. A computer implemented method for detecting correspondence of a built structure with a designed structure comprising the steps of:
   receiving an unorganized point cloud (PC) of the built structure, the unorganized PC containing a data set with a plurality of data points, each of which has an RGB value associated therewith;
   receiving an Industry Foundation Classes (IFC) model of the designed structure, the IFC model including an IFC schema file classifying all object types and object characteristics in the IFC model, the object characteristics including a model object RGB value unique to each IFC object's entity type;
   integrating the unorganized PC with the IFC model;
   identifying objects in the unorganized PC by determining the data points in the unorganized PC that correspond to an object in the IFC model, comprising the step of applying a ray casting object recognition technique from a scan origin on defined trajectories; and
   in which the ray casting object recognition technique includes the steps of: (i) targeting, for each data point, by casting a ray in that direction along a direction vector computed from the scan origin towards that data point; (ii) capturing, by the ray travelling through 3D space until it intersects with any object geometry representing the IFC model; (iii) defining, by checking an intersection result, whether a hit depth length of the ray after intersection minus the depth length of the ray between its origin and target point is below the maximum tolerance value, epsilon (ε); and (iv) storing data points, objects and ray depths within a maximum tolerance value, epsilon (ε); and
   generating a semantic point cloud, the semantic point cloud comprising the data points from the unorganized PC, and for those data points in the semantic point cloud that correspond to an object in the IFC model, overwriting the RGB value of the data point with the model object RGB value from the IFC model.

2. A computer implemented method as claimed in claim 1 in which the method comprises the intermediate step of: determining the scan origin.

3. A computer implemented method as claimed in claim 2 in which the method comprises the intermediate step of: defining trajectories from the scan origin to each of the data points in the data set of the unorganized PC.

4. A computer implemented method as claimed in claim 1 in which each of the captured data points are compared to the maximum tolerance value, epsilon (ε), and those data points that are within the maximum tolerance value epsilon (ε) with respect to each other are stored as associated data points.

5. A computer implemented method as claimed in claim 1 in which each of the data points that do not correspond to an object in the IFC model are stored separately.

6. A computer implemented method as claimed in claim 1 comprising the step of defining a unique ID for each data point.

7. A computer implemented method as claimed in claim 6 in which an IFC model object type global unique identification (GUID) tag is assigned to data points that correspond to an object in the IFC model.

8. A computer implemented method as claimed in claim 1 in which the method comprises the step of serializing the semantic point cloud.

9. A computer implemented method as claimed in claim 1 in which the IFC model is a model view definition (MVD).

10. A computer implemented method as claimed in claim 1 in which the IFC model is in a Step Physical File Format (SPFF).

11. A computer program product, including a non-transitory computer readable medium, having program instructions stored thereon that when operated on a computer, cause the computer to carry out the method steps of:

receiving an unorganized point cloud (PC) of the built structure, the unorganized PC containing a data set with a plurality of data points, each of which has an RGB value associated therewith;

receiving an Industry Foundation Classes (IFC) model of the designed structure, the IFC model including an IFC schema file classifying all object types and object characteristics in the IFC model, the object characteristics including a model object RGB value unique to each IFC object's entity type;

integrating the unorganized PC with the IFC model;

identifying objects in the unorganized PC by determining the data points in the unorganized PC that correspond to an object in the IFC model, comprising the step of applying a ray casting object recognition technique from a scan origin on defined trajectories; and in which the ray casting object recognition technique includes the steps of: (i) targeting, for each data point, by casting a ray in that direction along a direction vector computed from the scan origin towards that data point; (ii) capturing, by the ray travelling through 3D space until it intersects with any object geometry representing the IFC model; (iii) defining, by checking an intersection result, whether a hit depth length of the ray after intersection minus the depth length of the ray between its origin and target point is below the maximum tolerance value, epsilon ($\varepsilon$); and (iv) storing data points, objects and ray depths within a maximum tolerance value, epsilon ($\varepsilon$); and generating a semantic point cloud, the semantic point cloud comprising the data points from the unorganized PC, and for those data points in the semantic point cloud that correspond to an object in the IFC model, overwriting the RGB value of the data point with the model object RGB value from the IFC model.

12. A system for detecting correspondence of a built structure with a designed structure comprising a processor and a memory, the system further comprising:

means for receiving an unorganized point cloud (PC) of the built structure, the unorganized PC containing a data set with a plurality of data points, each of which has an RGB value associated therewith;

means for receiving an Industry Foundation Classes (IFC) model of the designed structure, the IFC model including an IFC schema file classifying all object types and object characteristics in the IFC model, the object characteristics including a model object RGB value unique to each IFC object's entity type;

means for integrating the unorganized PC with the IFC model;

means for identifying objects in the unorganized PC by determining the data points in the unorganized PC that correspond to an object in the IFC model, comprising means for applying a ray casting object recognition technique from a scan origin on defined trajectories; and in which the means for applying the ray casting object recognition technique includes: (i) means for targeting, for each data point, by casting a ray in that direction along a direction vector computed from the scan origin towards that data point; (ii) means for capturing, by the ray travelling through 3D space until it intersects with any object geometry representing the IFC model; (iii) means for defining, by checking an intersection result, whether a hit depth length of the ray after intersection minus the depth length of the ray between its origin and target point is below the maximum tolerance value, epsilon ($\varepsilon$); and (iv) means for storing data points, objects and ray depths within a maximum tolerance value, epsilon ($\varepsilon$); and means for generating a semantic point cloud, the semantic point cloud comprising the data points from the unorganized PC, and for those data points in the semantic point cloud that correspond to an object in the IFC model, having the RGB value of the data point overwritten with the model object RGB value from the IFC model.

13. A system as claimed in claim 12 in which there is provided means for determining the scan origin.

14. A system as claimed in claim 13 in which there is provided means for defining trajectories from the scan origin to each of the data points in the data set of the unorganized PC.

15. A system as claimed in claim 12 in which there is provided means to compare each of the captured data points to the maximum tolerance value, epsilon ($\varepsilon$), and a memory for storage of those data points that are within the maximum tolerance value epsilon ($\varepsilon$) with respect to each other as associated data points.

16. A system as claimed in claim 12 in which each of the data points that do not correspond to an object in the IFC model are stored separately.

17. A system as claimed in claim 12 in which there is provided means to define a unique ID for each data point.

18. A system as claimed in claim 17 in which an IFC model object type global unique identification (GUID) tag is assigned to data points that correspond to an object in the IFC model.

19. A system as claimed in claim 12 in which there is provided means to serialize the semantic point cloud.

20. A system as claimed in claim 12 in which the IFC model is a model view definition (MVD).

21. A system as claimed in claim 12 in which the IFC model is in a Step Physical File Format (SPFF).

* * * * *